(12) United States Patent
Selwyn et al.

(10) Patent No.: US 9,157,191 B2
(45) Date of Patent: Oct. 13, 2015

(54) TREATMENT OF FIBROUS MATERIALS USING ATMOSPHERIC PRESSURE PLASMA POLYMERIZATION

(75) Inventors: Gary S. Selwyn, Los Alamos, NM (US); Matthew R. Barnes, Santa Fe, NM (US); Caterina Vidoli, Albuquerque, NM (US); Heathcliff L. Vaz, Santa Fe, NM (US)

(73) Assignee: APJET, INC., Raleigh, NC (US)

( * ) Notice: Subject to any disclaimer, the term of this patent is extended or adjusted under 35 U.S.C. 154(b) by 873 days.

(21) Appl. No.: 11/556,130

(22) Filed: Nov. 2, 2006

(65) Prior Publication Data

US 2008/0107822 A1    May 8, 2008

(51) Int. Cl.
*H05H 1/00* (2006.01)
*B05B 5/00* (2006.01)
(Continued)

(52) U.S. Cl.
CPC ............... *D21H 25/04* (2013.01); *D06B 19/00* (2013.01); *D06M 10/10* (2013.01); *D06M 14/18* (2013.01); *D06M 15/277* (2013.01); *D21H 19/16* (2013.01); *D21H 19/32* (2013.01); *D21H 23/44* (2013.01)

(58) Field of Classification Search
CPC ........................... D06M 10/10; D06M 15/277
USPC .......... 427/488, 489, 490, 491, 535, 536, 538
See application file for complete search history.

(56) References Cited

U.S. PATENT DOCUMENTS 3,674,667 A    7/1972 Manion et al.
4,479,369 A   10/1984 Sando et al.

(Continued)

FOREIGN PATENT DOCUMENTS

JP    70006433 B    *    3/1970
JP    10087857         4/1998
WO    WO 98/58117    12/1998

OTHER PUBLICATIONS

International Search Report for PCT/US2007/82263, International Searching Authority, Mar. 31, 2008, pp. 1-5.
(Continued)

*Primary Examiner* — Elena T Lightfoot
(74) *Attorney, Agent, or Firm* — Samuel M. Freund; Cochran Freund & Young LLC (57) ABSTRACT

An apparatus and method for plasma finishing of fibrous materials including paper and knitted, woven and non-woven fibrous substrates such that desired characteristics are imparted are described. The method includes depositing a monomer comprising at least one fluorocarbon monomer with chemical additives, as required, at atmospheric pressure onto the paper or knitted, woven or non-woven substrate; exposing the monomer on a single surface of the fibrous material to an inert gas, atmospheric-pressure plasma, thereby causing polymerization of the monomer species; and repeating this sequence using multiple sequential deposition and plasma discharge steps to create a layered surface having durability against abrasion for both water-based laundry methods and dry-cleaning methods, and normal wear, without affecting the feel, drape, appearance or breathability of the substrate material. The present method uses a high-power, continuously operating plasma that is $10^4$ times more powerful than the prior art plasma sources utilized in the textile industry, and produces a durable finish with between 0.5 and 2 s of plasma exposure. This is sufficiently rapid to meet commercial fabric processing throughput, and repeated cleaning of the electrodes is not required.

24 Claims, 8 Drawing Sheets

(51) Int. Cl.

| | | |
|---|---|---|
| *D21H 25/04* | (2006.01) | |
| *D06B 19/00* | (2006.01) | |
| *D06M 10/10* | (2006.01) | |
| *D06M 14/18* | (2006.01) | |
| *D06M 15/277* | (2006.01) | |
| *D21H 19/16* | (2006.01) | |
| *D21H 19/32* | (2006.01) | |
| *D21H 23/44* | (2006.01) | |

(56) References Cited

U.S. PATENT DOCUMENTS

| | | | |
|---|---|---|---|
| 4,550,578 A | | 11/1985 | Sando et al. |
| 5,013,579 A | * | 5/1991 | Yamazaki ............... 427/571 |
| 5,032,461 A | * | 7/1991 | Shaw et al. ............... 428/461 |
| 5,041,304 A | | 8/1991 | Kusano et al. |
| 5,065,600 A | | 11/1991 | Byles |
| 5,312,667 A | | 5/1994 | Lumb et al. |
| 5,376,413 A | | 12/1994 | Callebert et al. |
| 5,597,456 A | * | 1/1997 | Maruyama et al. ....... 204/165 |
| 5,604,038 A | * | 2/1997 | Denes et al. ............. 428/429 |
| 5,895,558 A | * | 4/1999 | Spence .................... 204/164 |
| 5,961,772 A | | 10/1999 | Selwyn |
| 6,072,273 A | | 6/2000 | Schoenbach et al. |
| 6,106,659 A | | 8/2000 | Spence et al. |
| 6,151,928 A | | 11/2000 | Anyon et al. |
| 6,187,391 B1 | | 2/2001 | Kataoka et al. |
| 6,189,485 B1 | | 2/2001 | Matsuda et al. |
| 6,228,330 B1 | | 5/2001 | Herrmann et al. |
| 6,262,253 B1 | | 7/2001 | Russell-Jones et al. |
| 6,346,770 B1 | | 2/2002 | Schoenbach et al. |
| 6,503,564 B1 | * | 1/2003 | Fleming et al. ........... 427/255.6 |
| 6,525,127 B1 | | 2/2003 | Jariwala et al. |
| 6,649,222 B1 | | 11/2003 | D'Agostino et al. |
| 6,774,018 B2 | | 8/2004 | Mikhael et al. |
| 6,818,253 B2 | | 11/2004 | Kimbrell |
| 6,830,652 B1 | | 12/2004 | Ohmi et al. |
| 6,955,999 B1 | | 10/2005 | Boye |
| 7,049,379 B2 | | 5/2006 | Jariwala et al. |
| 2001/0031543 A1 | | 10/2001 | Ando et al. |
| 2002/0129902 A1 | | 9/2002 | Babayan et al. |
| 2003/0145389 A1 | | 8/2003 | Chen |
| 2003/0213561 A1 | | 11/2003 | Selwyn et al. |
| 2004/0011764 A1 | * | 1/2004 | De Vries et al. ............ 216/63 |
| 2004/0137647 A1 | | 7/2004 | Miyazaki et al. |
| 2004/0152381 A1 | | 8/2004 | York et al. |
| 2004/0194233 A1 | | 10/2004 | Mettrie et al. |
| 2004/0213918 A1 | | 10/2004 | Mikhael et al. |
| 2005/0199340 A1 | | 9/2005 | Selwyn et al. |
| 2005/0229327 A1 | | 10/2005 | Casella et al. |
| 2006/0048893 A1 | | 3/2006 | Selwyn et al. |
| 2007/0137573 A1 | | 6/2007 | Kholodenko et al. |

OTHER PUBLICATIONS

T. Stegmaier et al., "Plasma Technologies for Textiles," ed. R. Shishoo, Woodhead Publishing, 207, pp. 125-157.
Advisory Action, U.S. Appl. No. 11/317,374, pp. 1-9.
Final Office Action, U.S. Appl. No. 11/317,374, pp. 1-7.
Non-Final Office Action, U.S. Appl. No. 11/317,374, pp. 1-37.
Thiry, Maria C. Do You Believe in Magic. AATCC Review (Apr. 2006), p. 21-26.
AATCC Committee RA88. Standardization of Home Laundry Test Conditions. AATCC Technical Manual (2003) p. 402. US.
Examiner's Answer, U.S. Appl. No. 11/317,374, pp. 1-16, Dec. 24, 2009.
Examiner's Answer, U.S. Appl. No. 11/317,374, Dec. 24, 2009, pp. 1-17.
Michael A. Lieberman and Allan J. Lichtenberg, "Principles of Plasma Discharges and Materials Processing," John Wiley & Sons, Inc., 1994, pp. 167-171.
International Search Report for PCT/US2009/33144, International Searching Authority, Mar. 18, 2009, pp. 1-11.
T. Stegmaier et al., "Plasma Technologies for Textiles," ed. R. Shishoo, Woodhead Publishing, 2007, pp. 125-157.
International Search Report for PCT/US2006/62040, International Searching Authority, Mar. 17, 2008, pp. 1-10.
Advisory Action, U.S. Appl. No. 11/317,374, Jul. 2, 2009, pp. 1-9.
Final Office Action, U.S. Appl. No. 11/317,374, Apr. 22, 2009, pp. 1-7.
Non-Final Office Action, U.S. Appl. No. 11/317,374, Nov. 21, 2008, pp. 1-37.

* cited by examiner

TREATMENT OF FIBROUS MATERIALS USING ATMOSPHERIC PRESSURE PLASMA POLYMERIZATION

FIELD OF THE INVENTION

The present invention relates generally to surface treatments for flexible substrates and, more particularly, to the polymerization of chosen monomers on paper and knitted, woven and non-woven material substrates to impart desired characteristics using a continuously operating, atmospheric pressure, inert gas plasma.

BACKGROUND OF THE INVENTION

The use of various finishing processes is well-known in the manufacture of textile and nonwoven materials for imparting stain repellence, antistatic properties, ultraviolet fade resistance, fabric softening, and anti-microbial behavior, as examples. Finishing processes are most commonly applied by passing the fabric or nonwoven material through a chemical bath, in which the fabric picks-up, or absorbs, some of the chemical bath, followed by a thermal curing operation. Typically, finishing processes are applied to woven or knitted fabric, or non-woven substrates after they have been bleached and strengthened (such as through a mercerization process) and dyed. U.S. Pat. No. 6,525,127 describes the use of various fluorochemicals in a dip tank for finishing treatments for fabrics. In addition to dipping the fabric into a bath, conventional alternative methods involve the use of sprays, foams, roll-on addition of liquid chemicals, or atomizers. Silicones, siloxanes, fatty acids, and esters may also be added to the dip tank for fabric softening applications, as well as a means to impart stain repellency. To assist in the solubility of compositions which are not normally soluble in water, surfactants and emulsifiers are often added to obtain a consistent and uniform suspension of chemicals in the finishing bath.

Wet processes have several disadvantages. For example, (1) drying and curing may take several minutes, and may expose the material to high temperatures; (2) large ovens and frames are required for preventing shrinkage of the wet fabric; (3) additives necessary for solubilizing the desired compositions may penetrate the substrate or generate a thin film thereon, and may either decompose, leaving break-down products, or remain on the fabric as impurities during drying and curing; (4) some of these additives may assist in the removal of the finishing compositions when the fabric is dry cleaned, because of the non-polar nature of the dry cleaning process; (5) the chemical composition of the finishing bath may change over time because of different rates of absorption of the chemical species, with the result that finishing bath chemicals must be periodically replaced, thereby generating both cost and environmental impact; and (6) openings which naturally occur in woven or knitted yarns and provide comfort and breathability may clog as a result of the accumulation of macoscopic amounts of chemicals, as well as increasing the cost of finishing.

Many fabrics, such as leather, silk, rayon and wool, are best cleaned using non-water-based dry-cleaning processes. Other fibers, such as polypropylene and nylon used in nonwovens and textiles, are damaged by the heat required to dry and cure the active chemicals applied by a conventional wet finishing process. Polyester becomes "stiffer" due exposure to high-temperatures during curing.

Dry process methods used to achieve similar finishing properties while avoiding these difficulties include vacuum-based plasmas and atmospheric pressure plasmas, and have been used to apply finishing materials to flexible substrates, such as textiles and nonwoven materials. Plasma polymerization is an inherently low-temperature process, effectively eliminating the drying and curing steps required for wet finishing. This enables treatment of heat-sensitive fabric, saves energy, and reduces the cost and complexity of process equipment, because no tenter frames or ovens are required. Vacuum-based plasmas are generally easier to generate than atmospheric-pressure plasmas because the loss rate and generation rate of electrons are more readily controlled, and may operate with many applied feed gases. Atmospheric pressure plasmas are prone to arcing once a certain power density is exceeded inside the plasma volume, because of the greater density of electrons that result from the higher feed gas density.

Plasmas produce short-lived, active, chemical radicals, such as $CF_x$ from fluorochemical feed gases for textile finishing processes. Once generated in the gas phase by impact with energetic electrons with a fluorochemical feed gas, $CF_x$ radicals may attach to the surface of a fabric or other substrate, resulting in a low surface energy treatment that is hydrophobic to water and repellent to oils. This approach is described in U.S. Pat. No. 3,674,667 for "Process For Increasing Water Repellency Of Cotton Cloth" which issued to Jean P. Manion and Daniel J. Davies on Jul. 4, 1972.

The use of vacuum-based plasma for batch treatment of rolls of fabric or rolls of yarn is described in U.S. Pat. No. 4,479,369 for "Apparatus For Treating A Textile Product With The Use Of Low-Temperature Plasma" which issued to Yoshikazu Sando et al. on Oct. 30, 1984, and in U.S. Pat. No. 4,550,578 for "Apparatus For Low-Temperature Plasma Treatment Of A Textile Product" which issued to Yoshikazu Sando et al. on Nov. 5, 1985.

Alkylated fluorochemical oligomers have been successfully used in wet finishing processes, as described in U.S. Pat. No. 6,818,253 for "Method Of Producing Textile Substrates Having Improved Durable Water Repellency And Soil Release" which issued to William C. Kimbrell on Nov. 16, 2004, and U.S. Pat. No. 7,049,379 "Alkylated Fluorochemical Oligomers And Use Thereof In The Treatment Of Fibrous Substrates" which issued to Chetan P. Jariwal et al. on May 23, 2006, and show much improved durability of the finishing process against degradation after multiple laundry cycles.

Fluorochemical acrylates can also be polymerized using plasmas, and have been applied using both vacuum-based and atmospheric pressure plasmas. Such compositions are generally durable against multiple laundering processes. However, the long-chain fluorochemicals most effective for water and oil repellency are rapidly fragmented into $CF_x$ and $CO_xH_y$ moieties by impact from energetic plasma electrons, and the benefit from having an attached binding acrylate group may be lost. The fragmentation problem has been addressed by pulsing the plasmas; that is, by rapidly switching the electrical power applied to plasma on and off. The "on" period results in fragmentation of the feedgas followed by recombination, polymerization and cross-linking of the fluorochemical species, while during the "off" period, gas-phase collisional-recombination of the radical fragments reformulates a complex, fluorochemical polymer—hopefully having both the long-chain fluorinated group, used to repel water and oil, and the organic linking group suitable for binding to the textile—which may diffuse to the substrate without further fragmentation. By independently controlling the plasma "on" time and the plasma "off" time, the fragmentation rate and the gas-phase recombination rate may be controlled.

"Surface Coatings" by Jas Pal Singh Badyal et al., International Publication Number WO 98/58117, teaches a process whereby a stationary surface is exposed to a pulsed, vacuum-based plasma during passage of a perfluoralkyl acrylate feed gas, is coated by a film having both water and oil-repellent properties on the surface. A similar method was used in U.S. Patent Publication 2004/0152381, in which a pulsed plasma discharge was employed under vacuum conditions, with a fabric sample that was either static or slowly moving (0.4-0.6 m/min). The fluorocarbon feedstock is introduced in vapor form into a vacuum chamber, either using the equilibrium vapor pressure of the feedstock, or by directing a liquid feed into a heated tube, which converts the liquid into vapor. Fluorocarbon feedstocks include perfluorooctyl acrylate, which was also used in the WO 98/58117 patent, and perfluorododecene. Prior to treatment the fabric was dried to a chosen moisture level. U.S. Patent Publication 2004/0152381 also states that atmospheric pressure plasma excitation could be used, but does not teach how to perform the process at this pressure.

The electrodes for generating the plasma in U.S. Patent Publication 2004/0152381 are disposed in the vacuum chamber into which the fluorocarbon vapor is introduced, the plasma operating at the vapor pressure of the fluorocarbon gas. Similar results to those of the WO 98/58117 Publication were observed.

U.S. Patent Publication 2004/0152381 teaches that it is preferable to generate film coatings on the individual fibers having thicknesses between 2.5 nm and 20 nm in order to produce a fabric finish that has water and oil repellency with "excellent" durability against multiple agitation-laundry and dry-cleaning cycles, while also maintaining sufficient fabric air permeability for comfort. No laundry durability data is provided in the 2004/0152381 Publication.

Most plasmas do not penetrate sufficiently deeply into a film, so it is difficult to produce a film that is thicker than 20 nm. Layering methods where thin films are incrementally added are too slow for use in textile manufacturing.

U.S. Pat. No. 5,041,304 for "Surface Treatment Method" which issued to Yukihiro Kusano et al. teaches the use of an atmospheric pressure dielectric barrier discharge (DBD) in which the electrodes are covered with an insulator, or dielectric material, and a feedgas including a mixture of an inert gas (He) and a gas-phase, fluorinated compound, to deposit a water repellant film on a fabric.

In AATCC Review, 6, pages 21-26, April 2006) by Maria C. Thiry it is stated that: "the problem with conventional plasma processes is that surface molecular sophistication is severely limited by the aggressive nature of the plasma . . . . Essentially the plasma destroys any complex or long-chain molecule injected into the plasma as a precursor of the process." Thus, it is presently believed that high-power plasmas generate greater electron densities in the plasma and higher electron energy distributions which favors the fragmentation of the feedgas, and results in more product scrambling. International Publication No. WO 98/58117 and U.S. Patent Application Publication No. 2004/0152381 teach the use of low average powers. As an example, U.S. Publication No. 2004/0152381 teaches time-averaged power densities in the range between $1.1 \times 10^{-4}$ W/cm$^2$ and $2.27 \times 10^{-4}$ W/cm$^2$. Such low power densities are used to obtain plasmas with a low density of electrons and ions, because the electrons have sufficient energy to decompose the complex, fluorochemical monomers. The '304 patent does not disclose plasma power levels, but DBDs typically operate at low power densities.

Accordingly, it is an object of the present invention to provide an apparatus and method for finishing fibrous woven and nonwoven materials while maintaining open spaces between neighboring yarns for woven materials.

Another object of the present invention is to provide an apparatus and method for finishing fibrous woven and non-woven materials wherein the finished materials are durable against water-based laundry processes, dry-cleaning, and surface abrasion.

Still another object of the present invention is to provide an apparatus and method for finishing fibrous woven and non-woven materials effective for heat sensitive fabrics.

Yet another object of the present invention is to provide an apparatus and method for finishing fibrous woven and non-woven materials without the use of emulsifiers and surfactants.

It is yet another object of the present invention to provide a method for finishing fibrous knitted, woven and non-woven materials without requiring a thermal curing process.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention as embodied and broadly described herein, the method for treating a substrate with a finish having a chosen characteristic, hereof, includes the steps of: coating the surface of the substrate with at least one monomeric precursor of a polymer having the chosen characteristic; moving the coated substrate to a location away from the step of coating; and exposing the coated substrate to the products generated in an atmospheric pressure inert gas plasma at the location away from said step of coating the substrate, whereby the at least one monomeric precursor is polymerized, thereby forming the finish having the chosen characteristic.

In another aspect of the present invention, and in accordance with its objects and purposes, the method for finishing a substrate to have a chosen characteristic, the substrate being coated with a monomeric precursor to a polymer having the chosen characteristic, hereof, includes the step of: exposing the coated substrate the products generated in an atmospheric pressure inert gas plasma, whereby the monomeric precursor is polymerized, thereby forming a finish having the chosen characteristic.

In yet another aspect of the present invention, and in accordance with its objects and purposes, the apparatus for treating a substrate with a finish having a chosen characteristic, hereof, includes in combination: an evaporator for receiving at least one monomeric precursor of a polymer having the chosen characteristic in liquid form, and for generating a vapor therefrom; an applicator for receiving the vapor of the at least one monomeric precursor, and for spraying the vapor onto the substrate, thereby forming a coating thereon; means for moving the coated substrate to a location away from the applicator; and an inert gas atmospheric pressure plasma disposed at the location away from the applicator effective for polymerizing the at least one monomeric precursor, thereby forming the finish having the chosen characteristic.

In still another aspect of the present invention, and in accordance with its objects and purposes, the apparatus for treating a substrate with a finish having a chosen characteristic, the substrate being coated with a monomeric precursor of a polymer having the chosen characteristic, hereof, includes an inert gas atmospheric pressure plasma for exposing the coated substrate to products generated in the plasma, whereby the at least one monomeric precursor is polymerized forming the finish having the chosen characteristic.

Benefits and advantages of the present invention include, but are not limited to, a finishing process for fabric and nonwovens suitable for use during the manufacturing or during other finishing processes. The present invention further permits making substrates oleophobic and hydrophobic for stain resistance and stain release, and allows "bundled" processes, which may involve a stain-repellent finish in the same step as other finishing processes. Such processes may include antimicrobial, anti-static, sunlight fade resistance, fabric softening, or single-side hydrophilic/hydrophobic treatments, as examples. Yet another advantage of the invention is that finishing of a textile substrate using an inert gas plasma to induce polymerization may include mixing a polymerizable monomer or a mixture of such monomers with other chemicals to impart a range of attributes in the ultimate polymerized surface coating.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Briefly, the present invention includes the production of coatings on substrates for the purpose of imparting desirable properties thereto. The invention teaches a two-step process using selected chemical constituents that may be applied to at least one side of a fabric or other substrate in monomeric form, followed by atmospheric pressure plasma-induced polymerization of this surface film to more securely bind the film to the substrate such that the finish is durable against laundering and casual abrasion, and provide the desired attributes. Additional two-step cycles can be readily added for increased film thickness or durability, if desired.

Fabrics, as used herein, include, but are not limited to, textiles for casual, business or uniform apparel, home furnishings, furniture or transportation upholstery, hospitality items, such as table linens or napkins, carpets, felts, outdoor furniture, tarps or sunscreens, and any other fibrous items. Fabrics may be flexible, fibrous non-woven substrates, such as paper and paper bandages, disposable apparel or wipes. Desirable characteristics, as used herein, include, but are not limited to, water and oil stain repellency, insect-repellency, anti-static properties, fade resistance in sunlight and lighting conditions, fabric softening, and anti-microbial properties to reduce odor, infection, and formation of mold or mildew.

The present invention demonstrates that unpulsed, high-power plasmas produce durable coatings that may be applied using a plasma exposure of a second or less (as opposed to minutes), and that a continuously applied, effective power density for generating thicker, more durable coatings than those described in the prior art, may be between 1 and 5 W/cm$^2$ (This is between $10^2$ and $10^4$ times the power density reported for prior art plasmas). The range of effective rf frequencies may include any ac frequency that generates a "sheath" or dark space near the electrodes when capacitively coupled to the electrodes. Typical frequencies may be between 40 kHz and 100 MHz.

It is believed by the present inventors that a greater film thickness than taught in the art may be required to generate repellent film coatings that can withstand multiple laundry cycles (20+) due to the surface wear that occurs in a normal, agitation-based laundry process, or in the ordinary use of the fabric or nonwoven material. Such coatings may also withstand a greater number of dry cleaning cycles and more abrasion, and may have greater repellency against stains. The thicker coatings produced in accordance with the teachings of the present invention do not interfere with air permeability or breathability of the fabric, since the change in the gap between the yarn fibers is negligible; that is, the gap between fibers in a woven or knitted fabric is on the order of 100 μm, and adding an additional film thickness of greater than 70 nm has a negligible effect on the air permeability of the treated fabric.

Further in accordance with the teachings of the present invention, mixtures of monomeric species, such as DuPont telomer Zonyl® TA-N (See TABLE for Fluorotelomer Intermediate Composition/Ingredients), may be used in the chemical feed used to create a condensed film on the substrate, since monomeric mixtures having perfluoronated alkyl chains ranging from 4 to 14 carbon atoms may enhance the amount of cross-linking that occurs on the substrate during polymerization, as well as substantially reducing the chemical cost from purified chemical feedstocks, such as perfluorooctyl acrylate, (2-(Perfluorooctyl) ethyl acrylate; $C_{13}H_7F_{17}O_2$; CAS #27905-45-9), as taught in International Publication No. WO 98/58117 and U.S. Patent Application Publication No. 2004/0152381. Alternatively, DuPont telomer B Methylacrylate, sold under the trade name "Zonyl®™" (CAS #65530-66-7) may be used separately or in combination with Zonyl® TA-N.

TABLE

| Component Materials | CAS # | % |
|---|---|---|
| Perfluoroalkylethyl Acrylate Esters | 65605-70-1 | 87-95 |
| Perfluorohexylethyl Acrylate | 17527-29-6 | 1-7 |
| Perfluorooctylethyl Acrylate | 27905-45-9 | 42-56 |
| Perfluorodecylethyl Acrylate | 17741-60-5 | 22-30 |
| Perfluorododecylethyl Acrylate | 34395-24-9 | 6-12 |
| Perfluorotetradecylethyl Acrylate | 34362-49-7 | 1-5 |
| Perfluorohexadecylethyl Acrylate | 65150-93-8 | 0.1-2 |
| Water | 7732-18-5 | 0-1 |
| Perfluoroalkylethyl Alcohol | 65530-60-1 | 0.1-4 |
| 1,1,2,2-Tetrahydroperfluoro-1-Dodecanol | 678-39-7 | 0.1-2 |
| 1,1,2,2-Tetrahydroperfluoro-1-Decanol | 865-86-1 | 0-1 |
| Perfluoroalkylethyl Acrylate Polymer | NA | 0.1-3 |
| Perfluoroalkylethyl Iodides (Telomer B) | 71215-70-8 | 1-4 |
| Perfluorooctylethyl Iodide | 2043-53-0 | 0.5-2 |
| Perfluorodecylethyl Iodide | 2043-52-1 | 0.2-1 |

In addition to fluorochemical telomers, aliphatic and aromatic compounds, silicones, fatty acids and esters may be used as monomers, and may be added to the telomers or separately applied for specific purposes including cross linking polymer chains or for enhanced bonding to the substrate. As examples, the following compositions may be utilized by dissolving or emulsifying the material into a fluorocarbon feedstock (Zonyl® TA-N, as an example) and introducing the resulting mixture into the evaporator/applicator set-up. Many combinations of additives may be used, such as a hydrophobic agent/a softener plus a hydrophobic agent/a UV-absorber/a softener, plus a hydrophobic agent, plus a UV-absorber/or a UV-absorber dissolved in a non-fluorochemical monomer, such as 1,6, hexanediol diacrylate (SR-238, CAS #13048-33-4, available from Sartomer Company, Inc., Exton, Pa.), as examples.
 (a) UV-absorber and UV fade-resistant treatment:
  (i) Avobenzone (a common ingredient of sunscreen) also called Parsol 1789, $C_{20}H_{22}O_3$ [CAS number 70356-09-1], (UV-A absorber);
  (ii) Oxybenzone (a common ingredient of sunscreen) $C_{14}H_{12}O_3$, [CAS number 131-57-7], (UV-B absorber);
 (b) Softeners: (Esters):
  (i) Methyl Salicylate $C_8H_8O_3$, [CAS number 119-36-8];
  (ii) Octyl Acetate $C_{10}H_{20}O_2$, [CAS number 112-14-1];
 (c) Softeners: (Fatty Acids):
  Stearic Acid $C_{18}H_{36}O_2$, [CAS number 57-11-4]; and
 (d) Non-fluorochemical hydrocarbon-based monomer (used to dissolve above agents): 1,6 Hexanediol Diacrylate.

Some of these compositions are solid at room temperature. Application of such materials to substrates includes liquefaction thereof by heating to near the melting point (~70° C.), feeding the liquid stream into an evaporator which heats the mixture to a temperature higher than the boiling point of its highest boiling point component (~200° C.), and directing the resultant vapor containing the mixture of fluorocarbon components in a uniform distribution across the fabric, where condensation may occur. Since the substrate is at atmospheric pressure, and not in a vacuum, the condensate is stable on the fabric or other substrate, and the coated substrate may be moved to another region where the plasma-induced polymerization is generated. As stated hereinabove, the fluorocarbon gas is kept out of the plasma region to prevent rapid decomposition of the complex components due to electron impact in the plasma. This has the additional benefit of reducing the rate of film build-up on the plasma electrodes, and enables the present apparatus to be used for continuous operation, without the need for frequent cleaning of the electrodes.

Also in accordance with the teachings of the present invention, addition of small amounts of materials, such as methyl salicylate or methyl anthranilate (Methyl 2-aminobenzoate; 2-$(H_2N)C_6H_4CO_2CH_3$; CAS number 134-20-3), to the fluorochemical monomer mixture, has been found to "boost" both the water and oil repellency of the final product. This result is unexpected since it is well-known in the art that hydrocarbon-based chemicals may provide good water repellency, but to achieve oleophobicity requires fluorocarbon-based compositions, most commonly, telomers, and methyl anthranilate and methyl salicylate do not contain fluorine. However, testing by the present inventors show improved oil repellency by between 1 and 2 points on the "3M" oil test scale, and a between 2 and 3 point improvement in the "3M" water repellency results (U.S. Patent Application Publication No. 2004/0152381 provides a definition of the "3M" oil and water repellency tests.) was also observed. The cost of methyl anthranilate and methyl salicylate is lower than the chemical cost for the telomers commonly used for achieving oil repellency, such that the consumable cost for producing coatings having a specified repellency for both oils and water may be reduced. Additionally, this chemical "boost" effect may be used to offset a repellency reduction that results from the presence of other chemicals in the monomeric mixture used for achieving multiple fabric attributes, such as stain repellency combined with softening, or anti-microbial or UV absorbing functions. For the latter attribute, as stated hereinabove, one or more chemical additives that strongly absorb in the UV region of the spectrum is used. Such additives may have little hydrophobicity or oleophobicity properties when applied to fabric, and have a diluting effect on the fluorocarbon polymers to which they are added which may be compensated for by the addition of methyl anthranilate, or methyl salicylate.

In accordance with the teachings of the present invention, a relatively thick film of a monomeric fluorocarbon precursor may be deposited onto the fabric outside of the plasma region, and the coated fabric subsequently moved into the inert gas plasma where products such as metastable and ionic species generated in the plasma induce polymerization and cross-linking of the components in the deposited film. Because the polymerization process may propagate through a relatively thick film, the process of the present invention has a penetrating effect atypical of most plasma processes; that is, polymerization commences on the surface, where it is induced by plasma-generated active species, and propagates inward into the condensed film, including regions where gas phase species produced in the plasma would not normally penetrate. In this manner, the impact of a metastable species or ionic species on the surface of the monomer may induce many polymerization events through a chain reaction in the condensed film, even at locations in the film which are not directly exposed to the plasma. Since this process takes place in the electron-deficient sheath, this has the additional benefit of reducing the destruction of costly chemicals due to electron-impact of the gaseous precursor in the plasma.

In accordance with the teachings of the present invention, the use of an atmospheric pressure inert gas plasma, such as a He plasma, as an example, avoids chemical attack or degradation of the deposited film by fragmentation. Such degradation produces fluorine atoms and fluorine-containing radicals, as would be unavoidably present due to electron impact in the fluorocarbon gas mixtures used in the plasmas of International Publication No. WO 98/58117, U.S. Patent Application Publication No. 2004/0152381, and the '304 patent. It should be mentioned that the condition of atmospheric pressure thermalizes ions produced in the plasma; therefore, the metastable and ionic species produced in the plasma are effective for inducing polymerization and cross-linking of the components in the film, while remaining otherwise chemically unreactive. Clearly, argon, krypton, neon, and xenon may also be used as inert plasma gases.

It is well known that increasing the power applied to a plasma increases the thickness of the sheath, or "dark space", around an electrode. In a capacitively coupled plasma, such as that of the present claimed invention, the sheath has a time-average electric field that repels electrons. It therefore appears dark to the eye because it has a substantially reduced concentration of electrons which generate visible emission from gas phase species by excitation through electron impact. This reduced level of electron density in the sheath inhibits dissociation of the fluorocarbon monomer. Neutral metastables which are formed in the inert gas plasma, can readily cross the voltage drop of the sheath and induce polymerization.

Electrons can only transit the sheath for a short portion of the rf cycle and do so only to the extent necessary to maintain charge equalization. Positively charged ions transit the sheath and would, in a vacuum-based plasma, impact the substrate with sufficient energy (10-100 eV) to fragment the monomer, instead of simply polymerizing it. Therefore, in accordance with the teachings of the present invention, the fabric may be kept within the sheath region by placing it against either electrode or close thereto, where, high power applied to the plasma generates greater numbers of metastable species useful for initiating polymerization and cross-linking of the monomeric species condensed on the fabric, while avoiding the fragmentation of the monomer by energetic impingement of electrons or ions. In addition, plasma treatment processes for textiles and non-wovens may be substantially confined to the side of the substrate facing the plasma, if the substrate is held tightly against the electrode. Thus, a hydrophobic treatment can be applied to one side or both sides of a fabric using a fluorocarbon-containing feedstock and an inert gas plasma to induce polymerization.

Additionally, atmospheric pressure operation of the plasma, as opposed to vacuum-based plasmas where a high dc bias is generated in the sheath region, effectively eliminates bombardment of the monomer on the substrate by energetic ions which would have the same destructive effect as the electron impingement. That is, in an atmospheric pressure plasma, ions undergo frequent collisions with neutral gas phase species and thus do not acquire the kinetic energies they would otherwise develop in a plasma operated under vacuum. In atmospheric pressure plasmas, ions are thermalized to near room temperature (~0.03 eV, as opposed to between 10 and 100 eV for vacuum-based plasmas), rendering such species incapable of providing destructive impacts. Further, the atmospheric plasma source hereof is a "symmetric" plasma; that is, the area of the parallel rf-driven and ground electrodes are equal, and there is no grounded chamber wall contributing to the electrical behavior of the plasma. Thus, there is no dc bias, and the power density in the present invention may be $>10^4$ times higher than the power density suggested in the vacuum-based plasma of U.S. Patent Application Publication No. 2004/0152381. As used herein, "atmospheric pressure" plasmas are defined as operation of the plasma at a total gas pressure sufficiently high to create a plasma sheath in which collisions are effective for thermalizing the ions crossing the sheath. Typically, this occurs at pressures between 300 Torr and 3000 Torr. It is anticipated by the present inventors that pressures between 600 Torr and 800 Torr will be commonly employed.

The use of an inert gas plasma such as He is best suited for monomers that polymerize from free radical reactions, as is common for the acrylate chemistry taught herein. An inert gas plasma has the advantage of being capable of triggering the free radical polymerization process without chemically modifying the resultant polymer. In some situations, however, it may be advantageous to add a minor amount of reactive gases, such as $H_2$, $N_2$, $NH_3$, or $CF_4$, as examples, to the inert gas to alter the properties, performance or composition of the resultant polymer. The use of such gases in amounts typically less than 20% of the total gas flow, may be useful to drive other forms of polymerization, such as condensation reactions or cross-linking between polymer chains. The addition of $H_2$ might be helpful in promoting the polymerization of a monomer that requires the loss of an OH group through a condensation reaction. Similarly, the use of $N_2$ or $NH_3$ might promote crosslinking of a polymer chain, leading to greater durability for the resulting monomer.

In accordance with the teachings of the present invention, separate process modules operating at atmospheric pressure may be employed for: (1) condensing a film of fluorocarbon chemical on the fabric; and (2) exposing the condensate to an atmospheric pressure plasma. Alternatively, the condensation of the fluorochemical film and the polymerization process may be accomplished in the same chamber or no chamber, provided that a constant outward flow of helium or other inert gas is provided in part for keeping the monomer vapor away from the plasma region. This two-step process has benefits for providing durability of the fluorochemical film on the fabric, and for avoiding unwanted film deposition on the electrodes of the plasma system. Since film deposits do not form on the electrodes, the present fabric treatment system may be operated continuously and with less maintenance than where the gas-phase deposition species is formed in the plasma.

Figure 1:
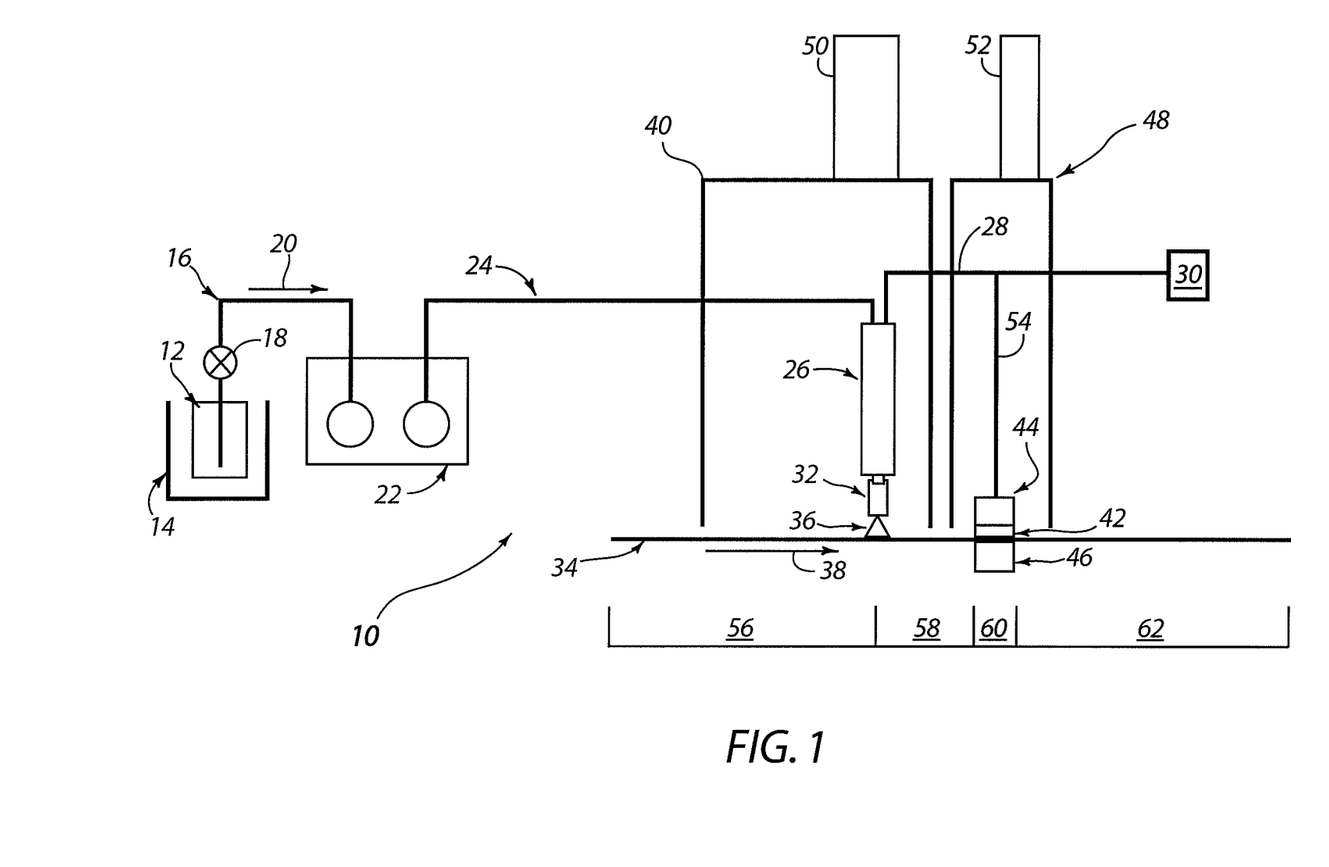
FIG. 1 shows a schematic representation of an embodiment of the apparatus of the present invention showing a first chamber containing apparatus for depositing a monomeric precursor of a desired characteristic-imparting polymeric material onto a moving fabric at atmospheric pressure in advance of plasma initiation of the polymerization thereof in a second atmospheric-pressure chamber.

Reference will now be made in detail to the present preferred embodiments of the inventions, examples of which are illustrated in the accompanying drawings. In the FIGURES, similar or identical structure will be identified using identical callouts. Turning now to FIG. 1, a schematic representation of a perspective view of one embodiment of apparatus, 10, of the present invention for inert gas, atmospheric-pressure plasma polymerization treatment of substrates, is shown. Vessel, 12, contains the monomeric mixture of fluorocarbon chemicals plus additives (as an example, Zonyl® TA-N plus between 10% and 20% methyl anthranilate, as an additive), and is disposed in heated enclosure, 14, such that the waxy solid chemical mixture may be liquefied. The monomeric mixture is drawn out of vessel 12 through heated tube, 16, in which valve, 18, is inserted in the direction shown by arrow, 20, into heated metering pump, 22. Temperature of the Zonyl® TA-N mixture is maintained above 60° C. to maintain it in a liquid state. A regulated and constant flow of monomers and other chemical exits metering pump 22 through heated line, 24, and is directed into evaporator unit, 26, which converts the liquid chemical feed into a gaseous stream. The evaporator is maintained between about 160° C. and 220° C. in order to fully vaporize all components of the monomeric mixture. Inert gas stream, 28, is introduced into evaporator 26 from gas source, 30, to direct the flow of vapor out of evaporator 26 and into applicator, 32, which includes a slit (shown in more detail herein) facing fabric, 34, such that gas stream, 36, containing the volatilized fluorochemical monomers and additives is directed onto fabric, 34. Fabric or nonwoven substrate 34 is moved in the direction of arrow, 38, such that the fabric is not heated by hot gas stream 36, and the volatile chemicals constantly condense onto a fresh section of fabric. The monomeric chemicals may be applied to fabric 34 inside chamber, 40, which helps to keep the fluorocarbon vapor away from plasma region, 42, in order to avoid generation of unwanted chemical radicals and unwanted film deposits on electrodes, 44 and 46. After condensation of the monomeric materials on the surface of fabric 34 facing the applicator 32, the fabric passes into second, atmospheric-pressure enclosure 48. Enclosures or chambers 40 and 48 include exhausts, 50 and 52, respectively. In enclosure 48, fabric 34 passes between electrodes 44 and 46 which are part of the atmospheric pressure plasma source, where inert gas plasma 42 is generated. This continuously-operating plasma is operated at power levels between 0.25 and 4 W/cm$^2$. For many applications power levels between 1 and 2 W/cm$^2$ are employed. Inert gas stream, 54, from source 30 which also supplies inert gas to evaporator 26 is the plasma gas. This condensation or deposition of monomeric species followed by plasma-induced polymerization may be repeated a chosen number of times for generating multiple coats of polymer, each formed on the previous coating, for greater durability. As stated hereinabove, one or more of the plasma discharges 42 may also employ an inert gas mixture including minor additions of reactive gas, such as $H_2$, $N_2$, $CF_4$, or $NH_3$, as examples, to promote cross-linking or other forms of polymerization reactions.

Region, 56, denotes the section in which no monomer is present (polymer may be present when multiple applicators and plasmas are employed, in which case region 56 would have polymer from an earlier treatment process); region, 58, identifies the section in which monomeric chemicals are applied; region, 60, denotes the plasma polymerization region which cures or polymerizes or cross-links the chemicals applied by the evaporator/applicator; and region, 62, identifies the region in which the fabric has been treated at least once. Not shown in FIG. 1 are: (1) the radio-frequency plasma power supply and matching network connected to the electrodes 44 and 46, and used to power and tune plasma 42; (2) water-cooling used to cool the electrodes 44 and 46 such that the gas temperature of the plasma may be maintained at or below 70° C.; (3) the compressed gas regulators for source 30; (4) the driver and rollers used to move fabric 34 across the applicator region, into the plasma region, and out of the plasma region; and (5) the pumps in exhausts 50 and 52 for collecting and recycling the inert gas, all of which are well known to persons of ordinary skill in the art. Fabric 34 may held against one electrode 46 to restrict the treatment process to one side thereof. Either electrode may be used for this purpose.

Typical dimensions for the electrodes for the laboratory plasma apparatus used are between 1 cm and 13 cm wide, by 30 cm long, with a gap of between 1 and 2.5 mm. Typical voltages may be between 120 and 450 V (peak-to-peak) at a frequencies including 13.56 MHz, 27.1 MHz and 40.68 MHz.

Figure 2:
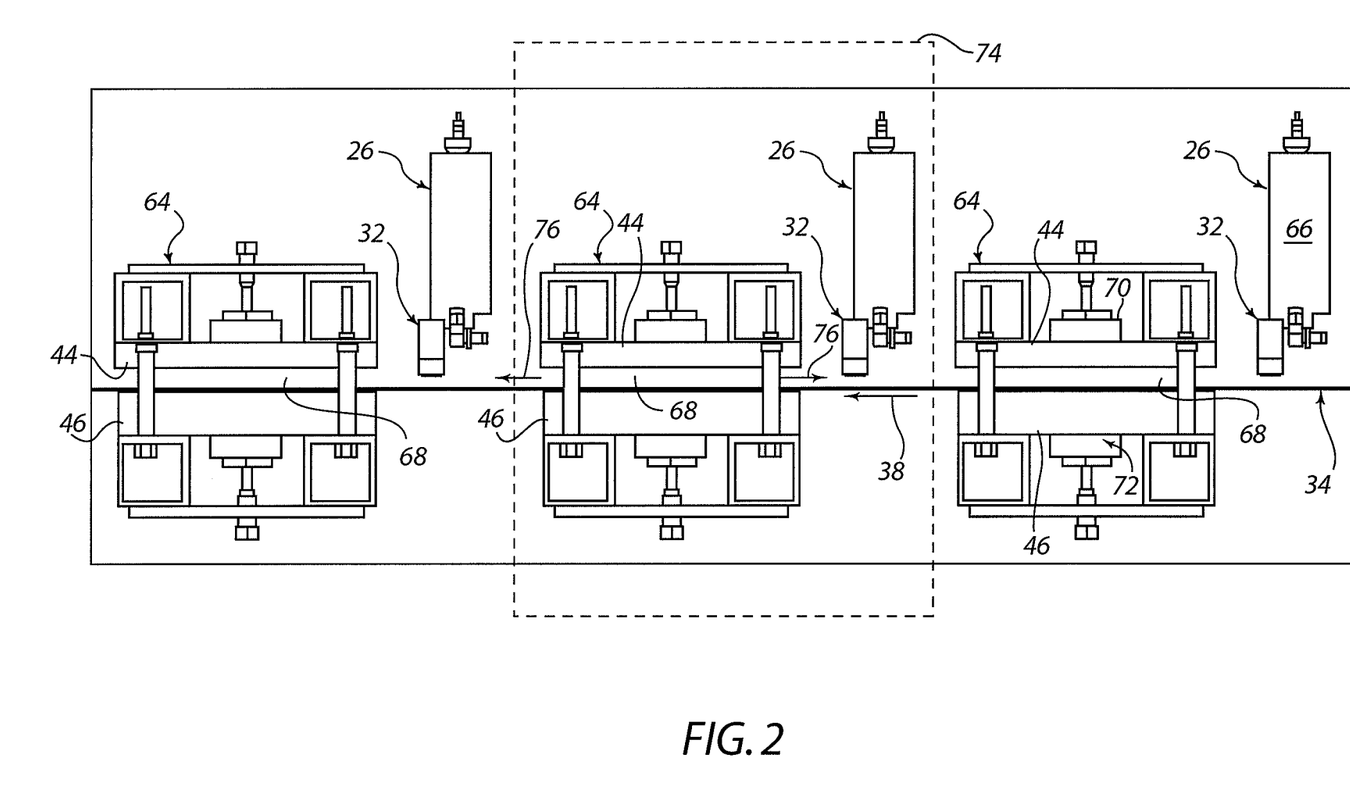
FIG. 2 shows a schematic representation of three sequentially disposed apparatus for monomer deposition and plasma polymerization for performing the fabric treatment process of the present invention shown in FIG. 1 hereof for a fabric moving from right to left, FIG. 2, by contrast, showing the monomer deposition apparatus and the plasma initiated polymerization apparatus co-located in the same chamber at atmospheric pressure.

FIG. 2 shows a schematic representation of three evaporator/applicators 26/32, each followed by an atmospheric plasma source, 64, such that fabric 34 is sequentially treated three times as it moves from right to left 38 in FIG. 2. Each evaporator/applicator applies a coating of monomer to the fabric followed by polymerization initiation by an atmospheric plasma source. Not shown in FIG. 2 are heated chemical feed lines through which the liquefied chemicals are transported to the evaporators, the inert gas feed lines that connect to evaporators 26, and the plasma electrodes 44 the reactive gas feed lines (if any), that may connect to the plasma electrodes 44, the roller mechanism for the fabric, and the atmospheric pressure plasma power sources. Fabric 34 is moved such that a section of fabric is first exposed to the vapor containing at least one monomeric species and chemical additives, if employed, from applicator, 32, where a condensed film of monomeric species and chemical additives is deposited, and then into plasma region, 68, between electrodes 44 and 46. Electrodes 44 and 46 are mounted in position with mounting hardware, 70 and 72, adjustable such that the gap between the electrodes may be controlled. One evaporator/applicator plus plasma polymerization apparatus is shown within dashed box, 74. In operation, a production treatment assembly may have between 1 and 12 such apparatus in order to meet fabric line speed requirements, and/or for enhanced durability requirements. Also not shown in FIG. 2 is the showerhead electrode design for electrode 44 in each apparatus. This electrode design is described in pending U.S. patent application Ser. No. 10/208,124, for "Atmospheric Pressure Plasma Processing Reactor," the teachings of which being hereby incorporated by reference herein. Since the inert gas flow (helium, as an example) emerges, 76, from the space between the fabric and electrode at approximately atmospheric pressure, the gas flow keeps the fluorocarbon vapor emitted from evaporators 32, from entering the plasma. This keeps the plasma region free of fluorocarbon deposits, even without the vented enclosures 40 and 48 illustrated in FIG. 1, hereof. The multiple evaporator/applicator units with accompanying multiple plasma sources shown in FIG. 2, may be enclosed within a single, vented chamber. It should be noted that the width of both the applicator apparatus and a plasma electrodes will typically be the width of the fabric being treated (between 48 and 72 in.).

Figure 3A:
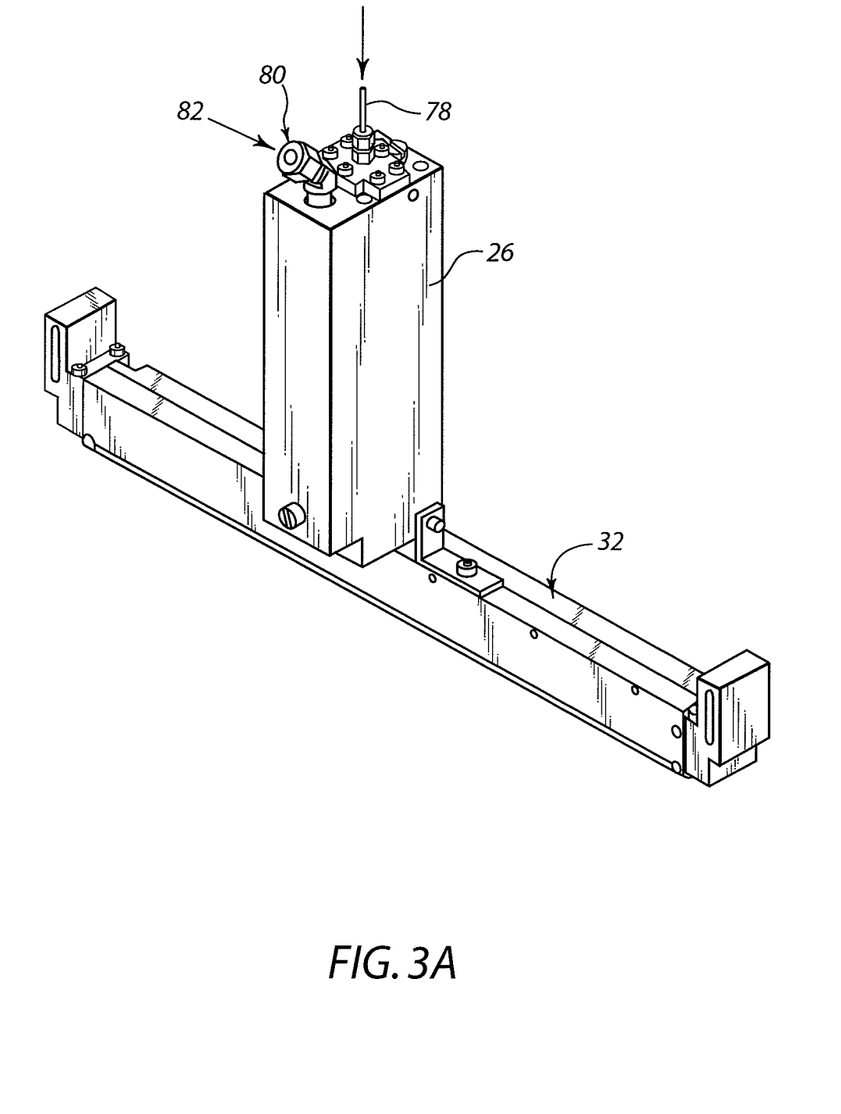
FIG. 3A shows a schematic representation of a projection view of the evaporator/applicator for depositing the monomeric precursor shown in FIG. 1 hereof.
Figure 3B:
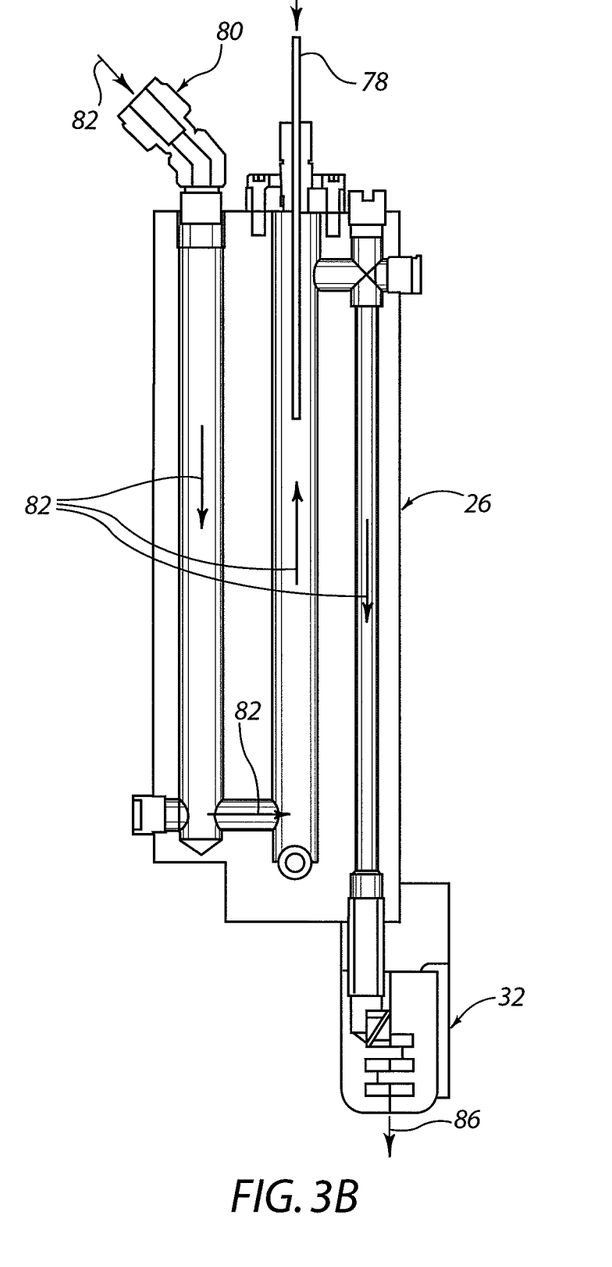
FIG. 3B shows a schematic representation of a cross-sectional view of the evaporator/applicator illustrated in FIG. 3A hereof.
Figure 3C:
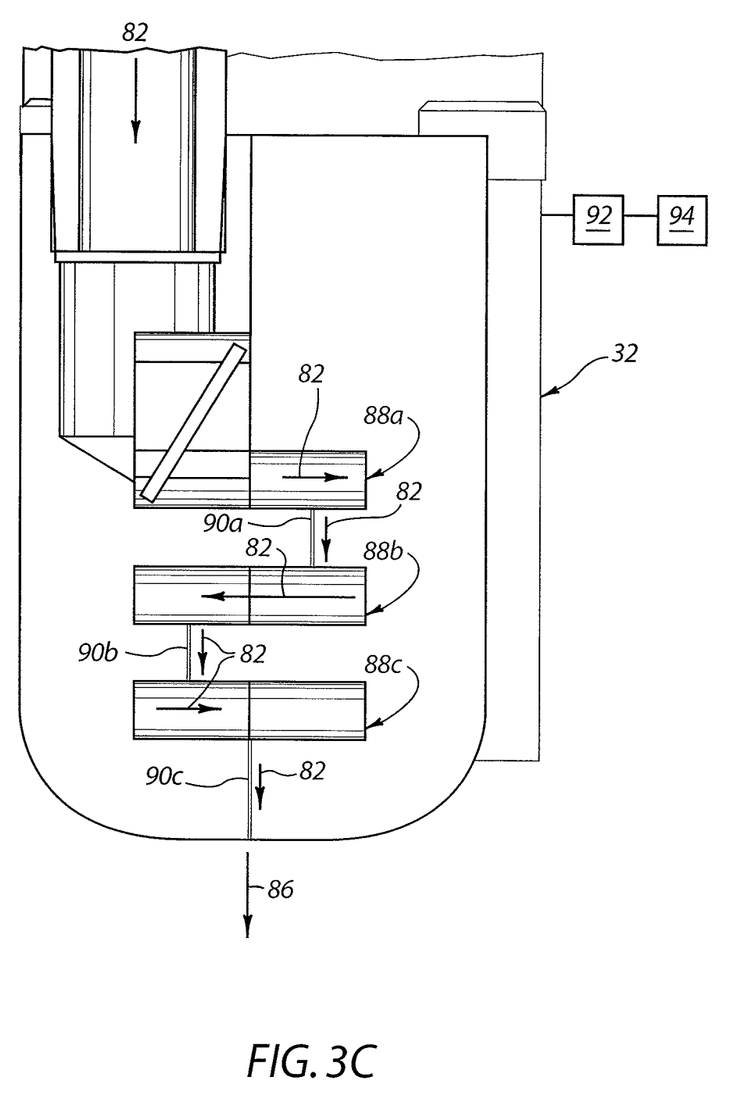
FIG. 3C shows a cross-sectional view of the applicator portion of the evaporator/applicator illustrated in FIG. 3B hereof.

FIG. 3a shows a schematic representation of a projection view of a typical evaporator 26 and applicator 32 of FIG. 1 hereof, illustrating monomer inlet, 78, and inert gas inlet, 80 into evaporator 26 and applicator 32. The vaporized chemical exits through a longitudinal slit on the base of applicator 32. FIG. 3b shows a schematic representation of cross-section view of evaporator/applicator 26/32, and the flow, 82, of inert gas and monomers through evaporator 26 into applicator 32 which uniformly distributes the flash-vaporized gas mixture, 86, through a slit, across the fabrics to be treated. Not shown in FIG. 3b are the heating units and power supplies for evaporator 26. FIG. 3c shows a schematic representation of a cross-section of applicator 32 and the means for uniform distribution of gases 82 across the length of the applicator (directed into the page). Shown are baffles, 88a-88c, and slits, 90a-90c, which permit the heated monomer/inert gas mixture to repeatedly expand and establish uniform flow 82, ultimately exiting as flow 86 though slit 90c at the bottom of evaporator 32. The fabric (not shown in FIG. 3c) may be positioned at distances ranging from flush against slit or nozzle 90c to approximately 0.200 in. from nozzle 90c. Heating unit, 92, powered by supply, 94, maintains applicator 32 at a sufficiently high temperature to prevent condensation of the monomers in the baffles and slits.

Having generally described the present method, more details thereof are presented in the following EXAMPLES.

Example 1

Figure 4:
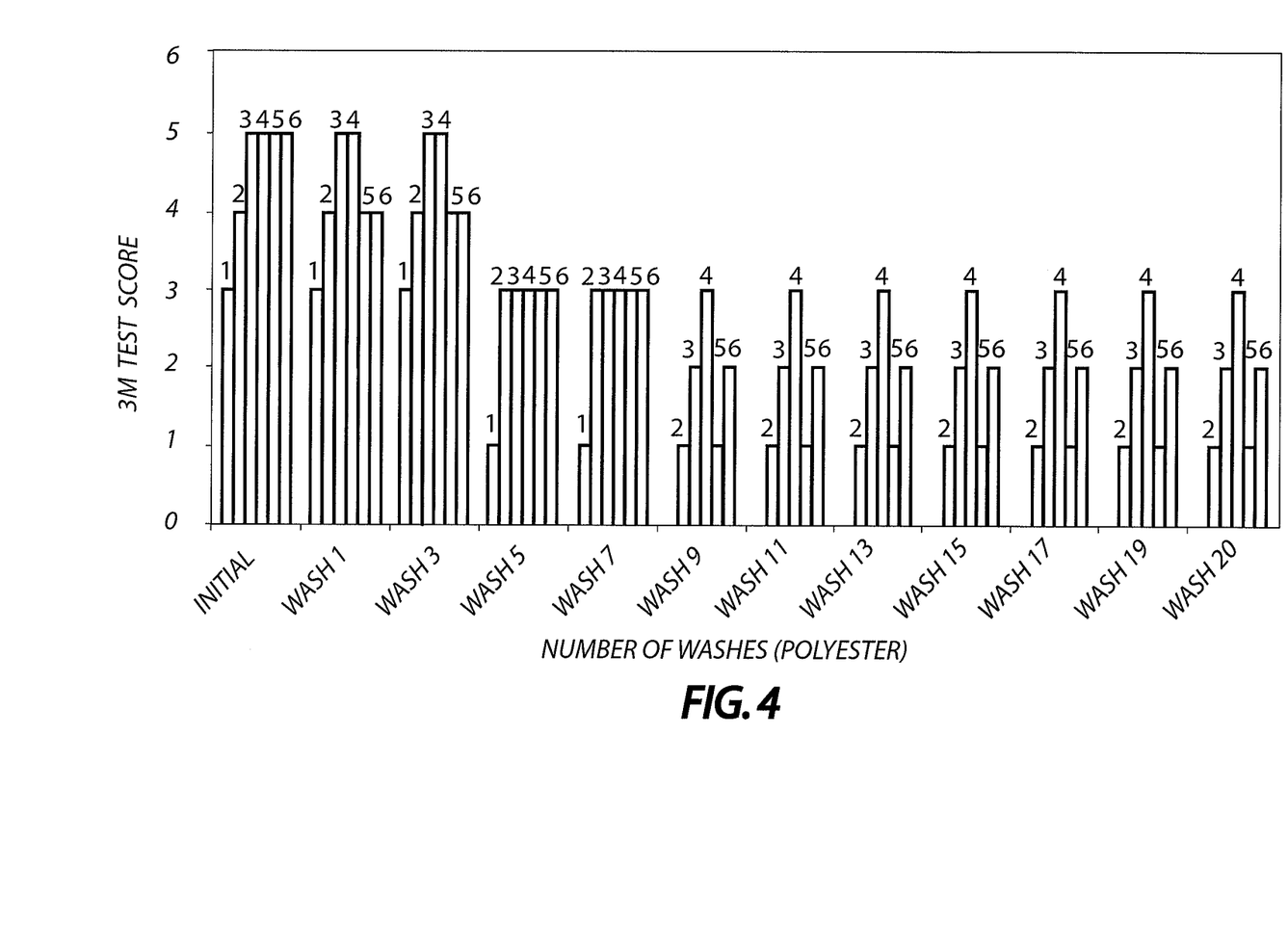
FIG. 4 is a graph of the 3M Test Score as a function of number of washes for several samples of 100% woven polyester fabric which were treated with Zonyl® TA-N, and processed with the embodiment of the apparatus schematically shown in FIG. 1.

FIG. 4 is a graph of 3M Test Score for hydrophobicity as a function of the number of wash and dry laundry cycles for 100% woven polyester (Mt. Vernon) fabric, plasma dry-treated for hydrophobicity using the apparatus shown in FIG. 1, with the following conditions: Zonyl® TA-N liquid feed of 0.4 ml/min, at a of 65° C., and an evaporator temperature of 175° C.; applicator temperature of 175° C.; web speed of 1.5 m/min; radio frequency power of 1.55 W/cm$^2$ at 13.56 MHz; and helium process gas. The electrode area used to generate the plasma was 33 cm×1.25 cm, the gap between the applicator and the fabric was 0.254 cm, and the gap between the fabric and the opposing rf electrode was 0.160 cm. This corresponds to a polymerization time inside the plasma of 0.5 s. Correspondingly, a 1 m width of plasma in the direction of the web travel requiring 0.5 s for polymerization would permit a maximum line speed of 120 m/min. The polyester fabric was initially at room temperature, with no pre-conditioning and was exposed to 4 or 8 sequential passes, depending on the sample. Sequential washing was performed using the AATCC (American Association of Textile and Color Chemists), "Standardization of Home Laundry Test Conditions (AATCC Technical Manual/2003, page 402) with a warm water wash (Tide detergent) followed by AATCC standard drying practices given in the same reference. No boost agent was used in this example. The numbers above the bars in FIG. 4 represent sequentially different samples treated and laundered.

Example 2

Figure 5:
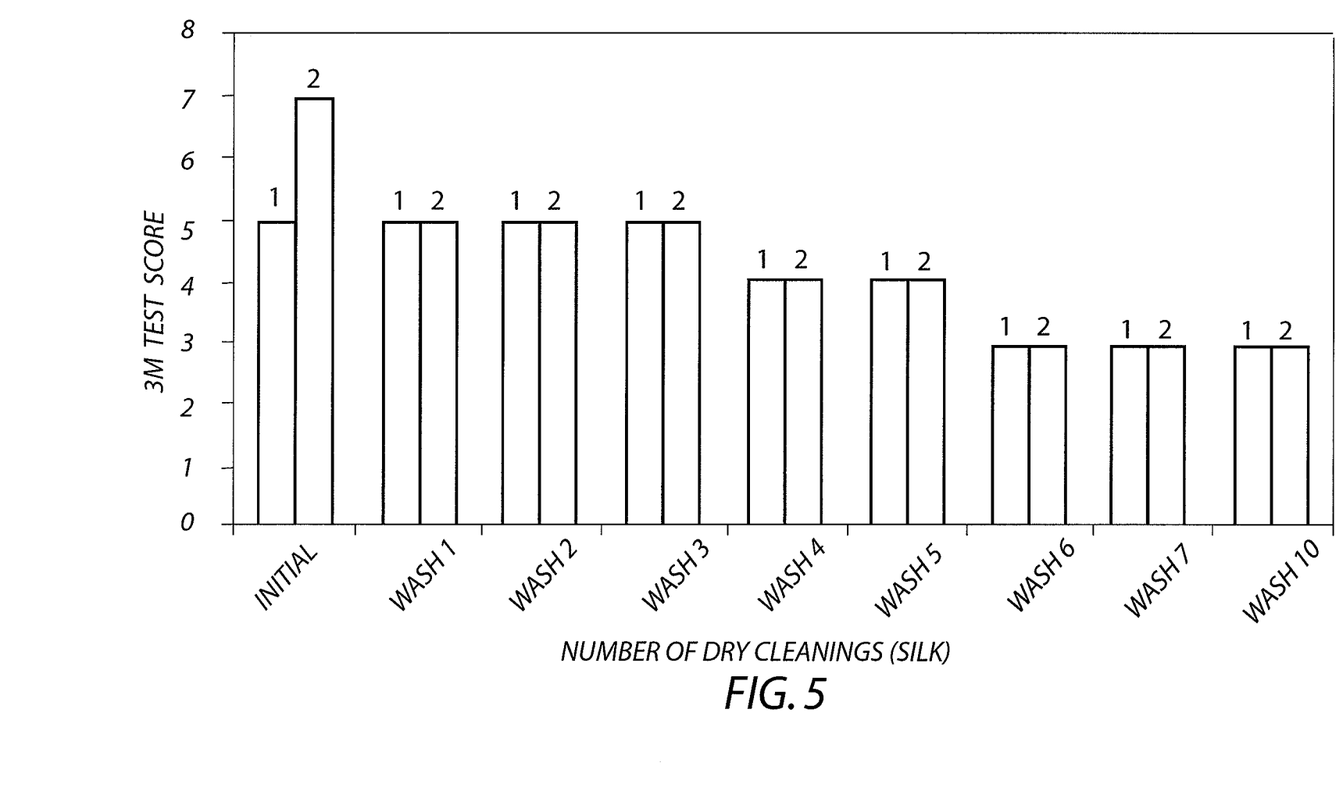
FIG. 5 is a graph of the 3M Test Score as a function of the number of dry cleaning procedures for two samples of woven silk fabric which were treated in the same manner as the polyester fabric of FIG. 4 hereof.

FIG. 5 is a graph of the 3M Test Score for hydrophobicity as a function of the number of dry cleanings for woven silk fabric (Dupioni), treated for hydrophobicity using the apparatus shown in FIG. 1. The silk was treated using the same process conditions used for the polyester treatment in EXAMPLE 1, hereof, except that only 4 sequential passes were made, and the durability results were obtained from a commercial dry-cleaning establishment. No boost agent was used in this example. The numbers above the bars in FIG. 5 indicate the results for two different samples treated.

Example 3

Figure 6:
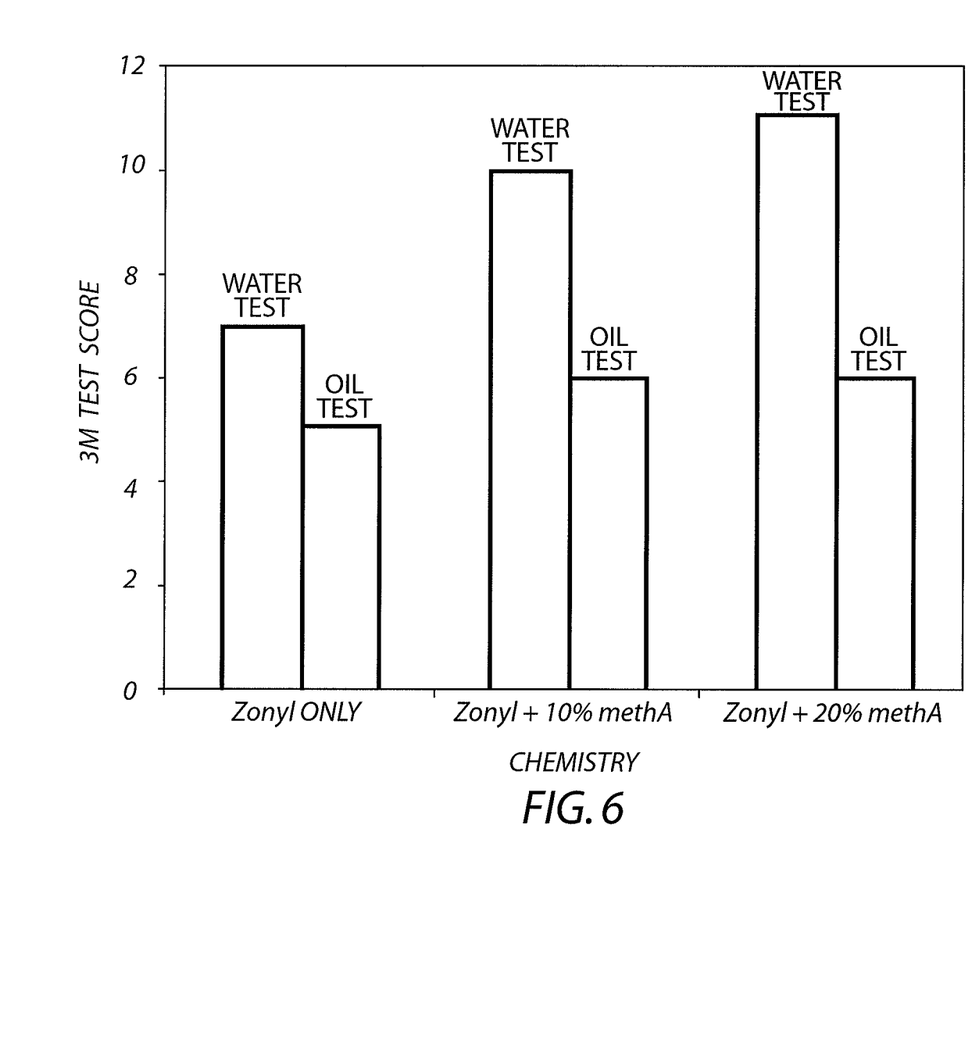
FIG. 6 is a graph of the 3M Test Score for oil and for water repellency for furniture upholstery fabric treated in the same manner as the polyester fabric of FIG. 4 hereof, for Zonyl TA-N, Zonyl TA-N with 10% by weight of methyl anthranilate, and Zonyl TA-N with 20% by weight of methyl anthranilate.

FIG. 6 is a graph of the 3M Test Scores for both water and oil repellency as a function of composition of monomer feed gas for furniture upholstery fabric (Sunbury Mills) treated for hydrophobicity using the apparatus shown in FIG. 1 hereof. Three compositions were applied: (1) only telomer chemistry (Zonyl® TA-N); (2) telomer chemistry plus 10% (by weight) of added methyl anthranilate; and (3) telomer chemistry plus 20% (by weight) of added methyl anthranilate. The "boost" effect for both water and oil repellency on the final result, is readily observed. Process conditions were as follows: Zonyl® TA-N was introduced at 0.4 ml/min, with a liquid feed temperature of 65° C., an evaporator temperature of 170° C., and an applicator temperature of 180° C.; the applied radiofrequency power was 1.55 W/cm$^2$ at 13.56 MHz; and the process gas was helium. The electrode area used to generate the plasma was 33 cm×1.25 cm, the gap between the evaporator and the fabric was 0.254 cm, and the gap between the fabric and the opposing rf-powered electrode was 0.160 cm. The upholstery fabric was initially at room temperature, with no pre-conditioning and was exposed to 4 sequential passes. No wash data was obtained for this sample.

In summary, the present invention includes the plasma-based polymerization of films thicker than 50 nm on the textile substrates, for improved durability and abrasion resistance of the film, without the need for frequent cleaning of the electrodes used for generation the plasma. The invention is suitable for a continuous operation in which the monomeric mixture is first applied to the substrate, then the substrate that is coated with condensed monomers (neat or applied with other chemicals) is moved into an atmospheric pressure plasma, whereby an inert gas plasma is used to polymerize and cross-link the film, without destroying the monomer. By operating the plasma at sufficiently high power (>0.25 W/cm$^2$, typically between 1 and 2 W/cm$^2$), it is possible to polymerize the monomeric film at a web speed of 10-100 m/min and using a electrode dimension (in the direction of web travel) of 10-200 cm. Operation at atmospheric pressure means that pre-conditioning of the fabric to a pre-set moisture level is not necessary. It is also not necessary to pulse the plasma, thereby enabling greater throughput of the apparatus, because the duty cycle of the treatment process is 100%.

The steps of: (1) fabric application of monomeric condensate, consisting of multiple, fluorocarbon monomers at atmospheric pressure; followed by (2) rapid polymerization or curing of the monomeric film by exposure to a continuous operating, inert gas plasma, to achieve a relatively thick film of polymer, but without change to the feel, permeability of drape of the fabric, may be repeated multiple times. Each repetition results in the deposition of a film on top of the previous film, thereby achieving higher levels of durability against wear or multiple laundry cycles. Because these steps are done at atmospheric pressure using an all-dry process, only a small monomer application apparatus and a small plasma apparatus are required to induce polymerization, a multiplicity of such pairs of apparatus may be combined in a single apparatus having a small footprint and operable in a continuous, production mode.

The present process may also be used to apply chemical finishing treatments using silicone or hydrocarbon-based monomers where: (1) the chemical monomer is vaporized and is uniformly condensed into a thin film across the fabric; (2) the fabric is moved away from the point of condensation to the plasma polymerization zone; and (3) the monomer is polymerized, or the chemical condensate is used to crosslink a previously polymerized film. Although silicone or hydrocarbon-based polymers are not generally oil repellant, they may provide fabric softening, UV absorbance or water repellency properties to the fabric. Alternatively, these monomers can be mixed with the fluorocarbon monomers and simultaneously applied and polymerized with these materials.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for continuously treating a substrate with a finish having a chosen characteristic, comprising the steps of:
coating the surface of said substrate by vapor condensation at atmospheric pressure with at least one monomeric precursor of a polymer having said chosen characteristic in a first chamber;
moving the coated substrate into a second chamber away from the first chamber;
generating an inert gas atmospheric pressure plasma in the second chamber in a volume between an rf electrode and a grounded electrode parallel thereto, wherein the inert gas emanates from either of the rf electrode or the grounded electrode into the volume;
applying sufficient rf power to the rf electrode such that an electron-deficient sheath region is generated in the vicinity of each electrode, the coated substrate being disposed within the sheath region of one of either the rf electrode or the grounded electrode; and
exposing the coated substrate to the products generated by the plasma in the second chamber, whereby the at least one monomeric precursor is polymerized, thereby forming said finish having said chosen characteristic.

2. The method of claim 1, wherein the plasma is generated using a frequency between 40 kHz and 100 MHz.

3. The method of claim 1, wherein the atmospheric pressure inert gas plasma is a continuously operating plasma.

4. The method of claim 1, wherein the inert gas is selected from the group consisting of helium, neon, argon, krypton, and xenon.

5. The method of claim 1, further comprising the step of mixing gases selected from the group consisting of $H_2$, $N_2$, $NH_3$, and $CF_4$, with the inert gas before said step of exposing the coated substrate.

6. The method of claim 1, wherein said substrate is a flexible substrate.

7. The method of claim 1, wherein said substrate is selected from the group consisting of paper, woven fibrous materials, non-woven fibrous materials, and knitted fibrous materials.

8. The method of claim 1, wherein said chosen characteristic is selected from the group consisting of oleophobicity, hydrophobicity, anti-microbial, anti-static, ultraviolet insensitivity, softness, fade resistivity, and durability.

9. The method of claim 1, wherein the at least one monomeric precursor is selected from the group consisting of fluorocarbon telomers, aliphatic compounds, aromatic compounds, and silicones.

10. The method of claim 9, wherein the at least one monomeric precursor comprises an acrylate moiety.

11. The method of claim 1, wherein said step of coating the surface of said substrate with at least one monomeric precursor includes coating the surface of said substrate with compositions selected from the group consisting of fatty acids, esters and materials which augment the chosen characteristic.

12. The method of claim 11, wherein the fatty acids comprise stearic acid, wherein the esters comprise octyl acetate and methyl salicylate, and wherein the characteristic augmenting materials comprise 1,6-hexanediol diacrylate, avobenzone or oxybenzone.

13. A method for continuously finishing a substrate with a chosen characteristic, said substrate being coated in a first chamber by vapor condensation at atmospheric pressure with at least one monomeric precursor of a polymer having a chosen characteristic, comprising the steps of: exposing the coated at least one monomeric precursor of a polymer to the products generated by an atmospheric pressure inert gas plasma in a second chamber formed in a volume between an rf electrode and a grounded electrode parallel thereto, wherein the inert gas emanates from either of the rf electrode or the grounded electrode into the volume; and applying sufficient rf power to the rf electrode such that an electron-deficient sheath region is generated in the vicinity of each electrode, the substrate being disposed within the sheath region of one of either the rf electrode or the grounded electrode, whereby the at least one monomeric precursor is polymerized, thereby forming said finish having said chosen characteristic.

14. The method of claim 13, wherein the plasma is generated using an rf frequency between 40 kHz and 100 MHz.

15. The method of claim 13, wherein the atmospheric pressure inert gas plasma is a continuously operating plasma.

16. The method of claim 13, wherein the inert gas is selected from the group consisting of helium, neon, argon, krypton, and xenon.

17. The method of claim 13, further comprising the step of mixing gases selected from the group consisting of $H_2$, $N_2$, $NH_3$, and $CF_4$, with the inert gas before said step of exposing said coated substrate.

18. The method of claim 13, wherein said substrate is a flexible substrate.

19. The method of claim 13, wherein said substrate is selected from the group consisting of paper, woven fibrous materials, non-woven fibrous materials, and knitted fibrous materials.

20. The method of claim 13, wherein said chosen characteristic is selected from the group consisting of oleophobicity, hydrophobicity, anti-microbial, anti-static, ultraviolet insensitivity, softness, fade resistivity, and durability.

21. The method of claim 13, wherein said at least one monomeric precursor is selected from the group consisting of fluorocarbon telomers, aliphatic compounds, and aromatic compounds.

22. The method of claim 21, wherein said at least one monomeric precursor comprises an acrylate moiety.

23. The method of claim 13, wherein the surface of said substrate is coated with at least one monomeric precursor and compositions selected from the group consisting of fatty acids, esters and materials which augment the chosen characteristic.

24. The method of claim 23, wherein the fatty acids comprise stearic acid, wherein the esters comprise octyl acetate and methyl salicylate, and wherein the characteristic augmenting materials comprise 1,6-hexanediol diacrylate, avobenzone or oxybenzone.

* * * * *